United States Patent
Fujita et al.

(10) Patent No.: US 8,840,844 B2
(45) Date of Patent: Sep. 23, 2014

(54) PLASMA GENERATING APPARATUS

(75) Inventors: Hideki Fujita, Kyoto (JP); Kibatsu Shinohara, Kanagawa (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 669 days.

(21) Appl. No.: 12/562,880

(22) Filed: Sep. 18, 2009

(65) Prior Publication Data

US 2010/0129272 A1    May 27, 2010

(30) Foreign Application Priority Data

Nov. 21, 2008    (JP) .................................. 2008-297518

(51) Int. Cl.
*H01J 37/32*    (2006.01)
*H01J 37/317*    (2006.01)
*H01J 37/02*    (2006.01)

(52) U.S. Cl.
CPC ..... *H01J 37/32678* (2013.01); *H01J 37/32357* (2013.01); *H01J 37/3171* (2013.01); *H01J 2237/0041* (2013.01); *H01J 37/32422* (2013.01); *H01J 37/026* (2013.01)
USPC .................. 422/186.29; 422/186; 422/186.03

(58) Field of Classification Search
CPC . H01J 37/026; H01J 37/0041; H01J 37/3171; H01J 37/32422; H01J 37/32678; H01J 37/32357
USPC ................................ 422/186.29, 186, 186.03
See application file for complete search history.

(56) References Cited

U.S. PATENT DOCUMENTS

| | | | |
|---|---|---|---|
| 5,107,170 A * | 4/1992 | Ishikawa et al. | 313/362.1 |
| 6,043,608 A * | 3/2000 | Samukawa et al. | 315/111.51 |
| 2003/0168011 A1 | 9/2003 | Lee et al. | |
| 2007/0017636 A1* | 1/2007 | Goto et al. | 156/345.47 |
| 2008/0218086 A1 | 9/2008 | Sakai | |

FOREIGN PATENT DOCUMENTS

| | | |
|---|---|---|
| GB | 2348738 A | 10/2000 |
| JP | 03020460 A | 1/1991 |
| JP | 8209341 A | 8/1996 |
| JP | 11102799 A | 4/1999 |
| JP | 11293470 A | 10/1999 |
| JP | 2000-223299 A | 8/2000 |
| JP | 2003-533022 A | 11/2003 |
| JP | 2004-281232 A | 10/2004 |

(Continued)

OTHER PUBLICATIONS

Office Action for Chinese Application No. 200910205161.3 Issued Sep. 27, 2011, with English translation thereof (15 pages).

(Continued)

*Primary Examiner* — Xiuyu Tai
(74) *Attorney, Agent, or Firm* — Osha Liang LLP

(57) ABSTRACT

The plasma generating apparatus includes: an antenna chamber which is disposed adjacently to a plasma chamber that produces a plasma, and which is exhausted to vacuum; an antenna which is disposed in the antenna chamber, and which radiates a high-frequency wave; a partition plate which is made of an insulator, which separates the plasma chamber from the antenna chamber to block a gas from entering the antenna chamber, and which allows the high-frequency wave radiated from the antenna to pass through the partition plate; and a magnet device which is disposed outside the plasma chamber, and which generates a magnetic field for causing electron cyclotron resonance in the plasma chamber.

6 Claims, 5 Drawing Sheets

(56) References Cited

FOREIGN PATENT DOCUMENTS

| | | |
|---|---|---|
| JP | 2005-256024 A | 9/2005 |
| JP | 4001185 | 8/2007 |
| WO | 98/33362 A1 | 7/1998 |
| WO | 2004/019397 A1 | 3/2004 |

OTHER PUBLICATIONS

Office Action for Japanese Application No. 2008-297518 mailed Feb. 14, 2012, with English translation thereof (8 pages).
Patent Abstract for Japanese Publication No. 2000-223299 Published Aug. 11, 2000 (1 page).
Patent Abstract for Japanese Publication No. 11-293470 Published Oct. 26, 1999 (1 page).
Patent Abstract for Japanese Publication No. 03-020460 Published Jan. 29, 1991 (1 page).
Patent Abstract for Japanese Publication No. 11-102799 Published Apr. 13, 1999 (1 page).
Patent Abstract for Japanese Publication No. 2005-256024 Published Sep. 22, 2005 (1 page).
Patent Abstract for Japanese Publication No. 08-209341 Published Aug. 13, 1996 (1 page).
Patent Abstract for Japanese Publication No. 2004-281232 Published Oct. 7, 2004 (1 page).

\* cited by examiner

PLASMA GENERATING APPARATUS

This application claims priority from Japanese Patent Application No. 2008-297518, filed on Nov. 21, 2008, the entire contents of which are hereby incorporated by reference.

FIELD OF THE INVENTION

The present invention relates to a plasma generating apparatus of an electron cyclotron resonance (ECR, the same shall apply hereinafter) type which is used for, for example, suppressing charge-up of a surface of a substrate during ion beam irradiation in an ion beam irradiating apparatus for irradiating the substrate with an ion beam to apply a process such as ion implantation.

DESCRIPTION OF RELATED ART

As an example of a plasma generating apparatus which is used for suppressing charge-up of a surface of a substrate, Japanese Patent No. 4,001,185 discloses a plasma generating apparatus having: a plasma chamber which is exhausted to vacuum, and into which a gas and a high-frequency wave are introduced; and an exit electrode which is disposed in one side (exit side) of the plasma chamber, and which has one or more holes. In the plasma generating apparatus, the gas is ionized in the plasma chamber by a high-frequency discharge, more specifically by using electron cyclotron resonance to generate a plasma, and the plasma is emitted to the outside through the exit electrode.

In the plasma chamber, a rod-like antenna which radiates the high-frequency wave is disposed along a longitudinal direction of the plasma chamber. The whole of the antenna in the plasma chamber is covered by an antenna cover made of an insulator. It is the principal object of the disposition of the antenna cover to prevent contamination in which metal particles constituting the antenna are discharged from the antenna by sputtering due to the plasma, to contaminate the plasma (i.e., metallic contamination), from occurring.

In the electron cyclotron resonance conditions, as well known, a magnetic field strength is 87.5 mT in the case where a frequency of the high-frequency wave is, for example, 2.45 GHz. A magnet which is disposed outside the plasma chamber applies a magnetic field for causing the electron cyclotron resonance, to a region including the antenna in the direction along the antenna.

In the related-art plasma generating apparatus, the antenna is passed through a portion where the electron cyclotron resonance conditions are satisfied, and hence a dense plasma is generated in the vicinity of the antenna. This dense plasma causes a large thermal input and intense sputtering in the antenna cover. Therefore, the antenna cover is consumed.

If a hole is opened as result of the consumption of the antenna cover, the plasma directly sputters the antenna, and metal particles constituting the antenna are discharged, thereby causing the above-described metallic contamination. Therefore, the life period of the antenna cover is one of factors deciding that of the plasma generating apparatus.

SUMMARY OF INVENTION

Illustrative aspects of the present invention provide a plasma generating apparatus of the ECR type having an antenna in which the problem of consumption of an antenna cover due to a plasma can be solved.

A plasma generating apparatus for generating and emitting a plasma to an outside of the plasma generating apparatus, includes: a plasma chamber which is exhausted to vacuum, into which a gas and a high-frequency wave are introduced; an exit electrode which is disposed in one side of the plasma chamber, and which includes one or more holes through which the plasma passes; an antenna chamber which is disposed adjacently to the plasma chamber, and which is exhausted to vacuum; an antenna which is disposed in the antenna chamber, and which radiates the high-frequency wave; a partition plate which is made of an insulator, which separates the plasma chamber from the antenna chamber to block the gas from entering the antenna chamber, and which allows the high-frequency wave radiated from the antenna to enter the plasma chamber; and a magnet device which is disposed outside the plasma chamber, and which, in the plasma chamber, generates a magnetic field that causes electron cyclotron resonance, in a direction intersecting with a direction along which the plasma is emitted from the exit electrode.

Other aspects and advantages of the invention will be apparent from the following description, the drawings and the claims.

DETAILED DESCRIPTION OF EXEMPLARY EMBODIMENTS

Figure 1:
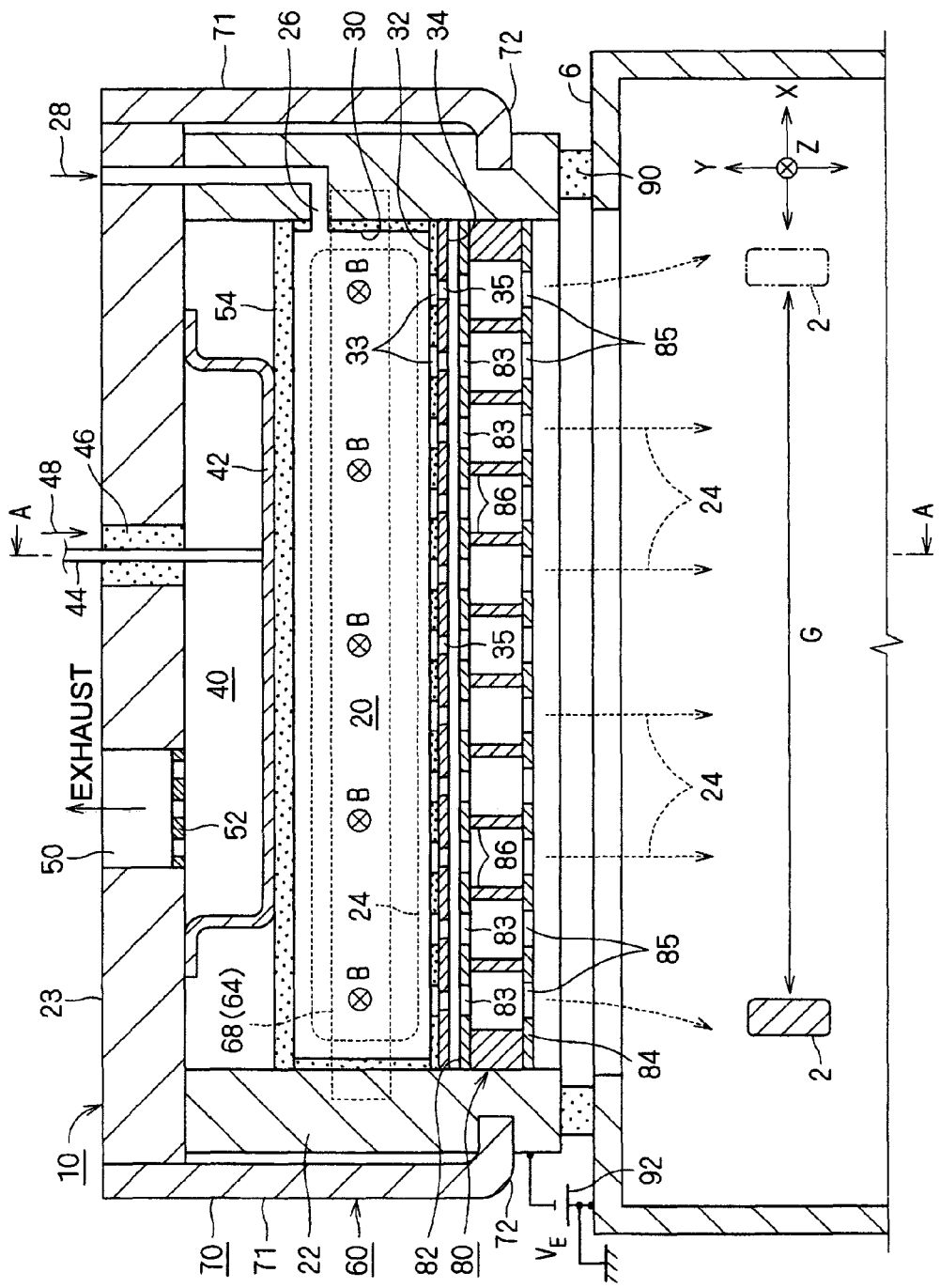
FIG. 1 is a sectional view showing an exemplary embodiment of a plasma generating apparatus of the invention.
Figure 2:
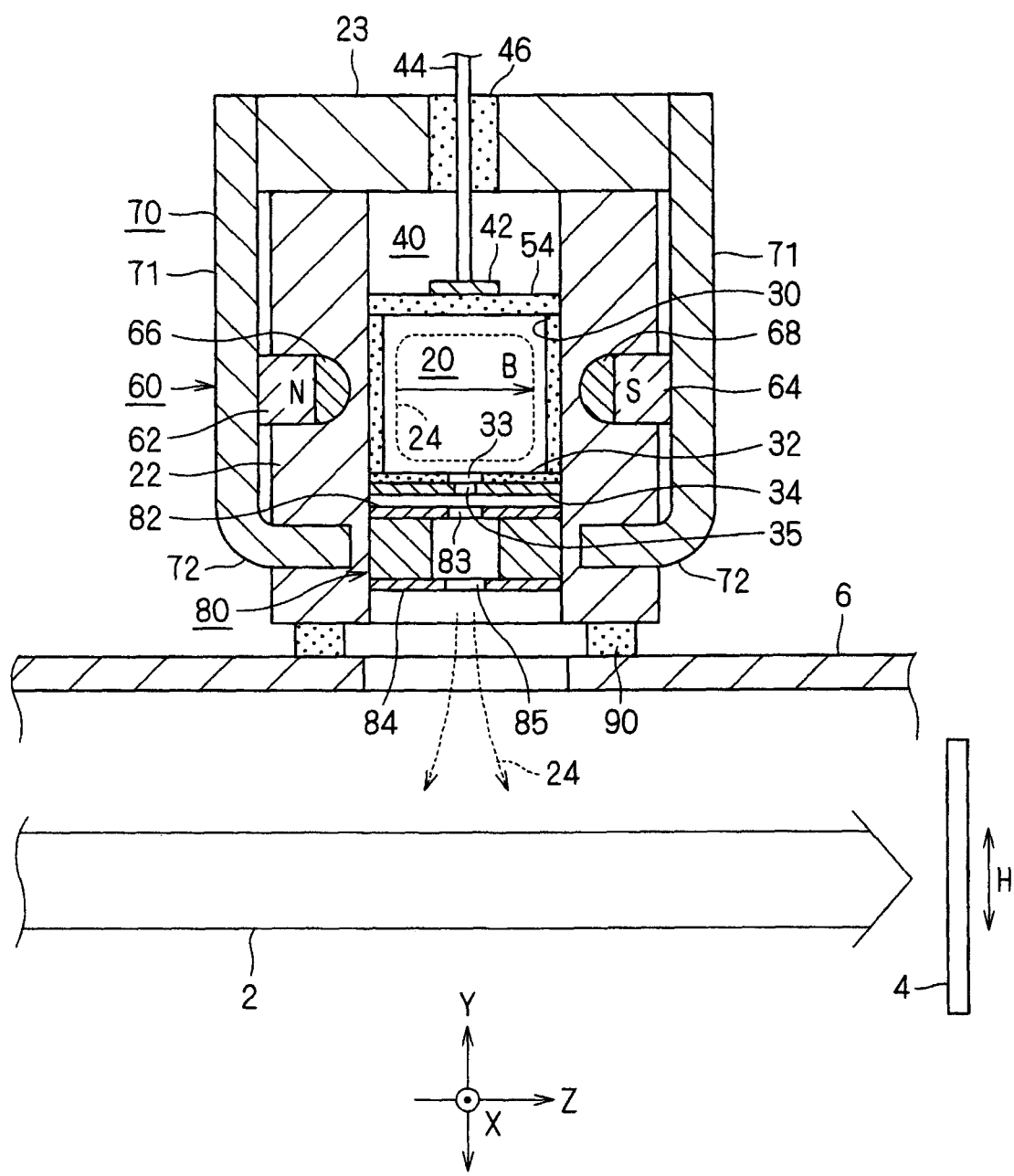
FIG. 2 is a sectional view taken along line A-A in FIG. 1.

FIG. 1 is a sectional view showing an exemplary embodiment of a plasma generating apparatus of the invention, and FIG. 2 is a sectional view taken along line A-A in FIG. 1.

Although described in detail later, the plasma generating apparatus 10 has: a plasma chamber 20 which is exhausted to vacuum, and into which a gas 28 and a high-frequency wave 48 (this is introduced through a partition plate 54 that will be described later) are introduced; and an exit electrode 80 which is disposed in one side (exit side) of the plasma chamber 20, and which has one or more holes. In the plasma chamber 20, the gas 28 is ionized by using electron cyclotron resonance to generate a plasma 24, and the plasma 24 is emitted to the outside through the exit electrode 80.

The plasma generating apparatus 10 further has: an antenna chamber 40 which is disposed adjacently to the plasma chamber 20, and which is exhausted to vacuum; an antenna 42 which is disposed in the antenna chamber 40, and which radiates the high-frequency wave 48; the partition plate 54 which is made of an insulator, which separates the plasma chamber 20 from the antenna chamber 40 so as to block the gas 28, and which allows the high-frequency wave 48 radiated from the antenna 42 to enter the plasma chamber 20; and a magnet device 60 which is disposed outside the plasma chamber 20, and which generates a magnetic field B that causes the electron cyclotron resonance, in a direction (in this example, the Z direction which will be described later, or alternatively the opposite direction may be possible) intersecting with a direction (the Y direction which will be described later) along which the plasma 24 is emitted from the exit electrode 80. No gas is introduced into the antenna chamber 40.

A strength of the magnetic field B which is generated in the plasma chamber 20 by the magnet device 60 is set so as to satisfy the electron cyclotron resonance conditions. In the case where the frequency of the high-frequency wave 48 is 2.45 GHz in the microwave band, for example, the strength is about 87.5 mT.

For example, the magnet device 60 may be a permanent magnet, a combination of a permanent magnet and a yoke, or an electromagnet. Alternatively, the magnet device 60 may have a structure which will be described later.

The exit electrode 80 may be configured by, for example, one electrode, or a plurality of electrodes. In the case of one electrode, the exit electrode may be formed integrally with a container (for example, a vacuum container 22 which will be described later) for forming the plasma chamber 20, as a part of the container. The hole of the exit electrode 80 is formed by an arbitrary number of 1 or more, or may have a slit-like shape. Alternatively, the exit electrode 80 may have a structure which will be described later.

In the plasma generating apparatus 10, the antenna chamber 40 into which no gas is introduced, and which is exhausted to vacuum is separated from the plasma chamber 20 into which the gas 28 is introduced, by the partition plate 54, so that the plasma 24 is generated only in the plasma chamber 20, and not generated in the antenna chamber 40. Therefore, the antenna 42 is not exposed to the plasma 24, and hence an antenna cover for protecting the antenna 42 from the plasma 24 is not necessary, whereby the problem of consumption of an antenna cover due to the plasma 24 can be solved.

Although the partition plate 54 is exposed to the plasma 24 in the plasma chamber 20, the partition plate 54 is in the end of the plasma chamber 20, and remote from the dense plasma 24. As compared with the antenna cover in the related art, therefore, the thermal input and sputtering due to the plasma 24 occur in the partition plate 54 at a lower degree. Consequently, the consumption of the partition plate 54 is less than that of the antenna cover in the related art, and the life period of the partition plate 54 is prolonged. As a result, the life period of the plasma generating apparatus 10 can be made longer.

The magnet device 60 generates the magnetic field B in the direction intersecting with the direction along which the plasma 24 is emitted from the exit electrode 80. Therefore, electrons in the plasma 24 emitted to the outside are mainly configured by electrons of low energy, and it is possible to prevent electrons of high energy from being contained in the emitted plasma 24. This situation is caused by the following phenomenon. The electrons in the plasma 24 generated in the plasma chamber 20 include high-energy electrons which are accelerated by the electron cyclotron resonance. However, these high-energy electrons move along the magnetic field B in the direction intersecting with the emission direction of the plasma 24, and hence collide with the wall face (for example, an insulator 30 which will be described later) of the plasma chamber 20, to disappear. Therefore, electrons in the plasma 24 emitted to the outside are mainly configured by low-energy electrons which have been repeatedly collided with gas molecules to have a low energy.

As a result, as in an exemplary embodiment which will be described later, in the case where charge-up in a substrate 4 due to irradiation of an ion beam 2 is suppressed by using electrons in the plasma 24, for example, a negative charge-up voltage in the substrate 4 can be suppressed to a low level. This situation is caused because, when electrons are excessively supplied to the substrate 4, the substrate 4 is negatively charged up, but the charge-up voltage is increased only to a voltage corresponding to the energy of the electrons.

Next, a more specific exemplary embodiment of the plasma generating apparatus 10 will be described.

FIGS. 1 and 2 shows an example where the plasma generating apparatus 10 is used in an ion beam irradiating apparatus for irradiating the substrate (for example, a semiconductor substrate) 4 in a vacuum chamber 6 with the ion beam 2 to apply a process such as ion implantation on the substrate 4 (in the case where ion implantation is performed, the apparatus is called an ion implanting apparatus). The plasma generating apparatus 10 is attached via an insulator 90 to the outside of the vacuum chamber 6 located in the vicinity of the upstream side of the substrate 4.

It is assumed that a traveling direction of the ion beam 2 is set as a Z direction, and two directions which are substantially perpendicular to each other in a plane that is substantially perpendicular to the Z direction are set as an X direction (for example, the horizontal direction) and a Y direction (for example, the vertical direction), respectively. In this example, the ion beam 2 is reciprocally scanned in the X direction by an electric field or a magnetic field as indicated by the arrow G in FIG. 1. The substrate 4 is reciprocally scanned in a mechanical manner in the Y direction as indicated by the arrow H in FIG. 2. By cooperation (hybrid scanning) of the two scanning, the whole surface of the substrate 4 is uniformly irradiated with the ion beam 2, so that ion implantation of high uniformity can be performed.

Alternatively, the ion beam 2 may be an ion beam having a ribbon-like shape which is wide in the X direction without undergoing scanning. In the following, the plasma generating apparatus 10 will be described by exemplifying the case where the ion beam 2 is scanned in the X direction. Also in the case where the ion beam is the above-described ribbon-like ion beam, the plasma generating apparatus 10 is similarly configured.

When the substrate 4 is to be ion implanted, the plasma 24 emitted from the plasma generating apparatus 10 is supplied to the vicinity of the ion beam 2 or the substrate 4, and positive charges due to ion beam irradiation are neutralized by using electrons in the plasma 24, whereby charge-up of the surface of the substrate 4 can be suppressed.

In the exemplary embodiment, in order to cope with the scanning of the ion beam 2 in the X direction, the plasma generating apparatus 10 has a structure which is elongated in the X direction. According to the configuration, the plasma 24 which is wide in the X direction is emitted, the plasma 24 is evenly supplied to the vicinity of the ion beam 2 which is scanned in the X direction, so that charge-up can be evenly suppressed in the surface of the substrate 4.

The plasma generating apparatus 10 has the vacuum container 22, and, in the vacuum container 22, the plasma chamber 20 and the antenna chamber 40 are vertically adjacently formed across the partition plate 54. The vacuum container 22 has a rectangular tubular shape which is elongated in the X direction (in other words, the long side extends in the X direction). Therefore, also the plasma chamber 20 and the antenna chamber 40 have a shape which is elongated in the X direction.

The components which are near the magnet device 60, such as the vacuum container 22 (except an upper lid 23), the antenna 42, and the exit electrode 80 are configured by a nonmagnetic material so that the magnetic field B generated by the magnet device 60 is not disturbed. In the exemplary embodiment, the upper lid 23 of the vacuum container 22 functions also as a part of a yoke (described later) of the magnet device 60, and hence is formed by a magnetic material (more specifically, a ferromagnetic material). In order to reduce a high-frequency loss, the surface of the magnetic material may be covered by silver plating or the like.

The plasma chamber 20 is exhausted to vacuum from the side of the exit electrode 80 (i.e., through the exit electrode 80) by a vacuum exhaust apparatus which is not shown, and the gas 28 is introduced into the plasma chamber 20 through a gas introduction port 26. For example, the gas 28 is xenon gas. However, the gas is not restricted to this.

Furthermore, the high-frequency wave 48 radiated from the antenna 42 is introduced into the plasma chamber 20 through the partition plate 54. Because of the high-frequency wave 48 and the magnetic field B generated by the magnet device 60, the gas 28 can be ionized in the plasma chamber 20 by using electron cyclotron resonance, to generate the plasma 24.

Preferably, the wall face surrounding the plasma chamber 20 is covered by an insulator as wide as possible. According to the configuration, the phenomenon that particles (for example, metal particles) constituting the vacuum container 22 and the like are discharged therefrom by sputtering due to the plasma 24, to contaminate the plasma 24 can be suppressed. In the exemplary embodiment, the upper face of the plasma chamber 20 is configured by the partition plate 54 made of an insulator, and hence the side face and lower face (exit face) of the plasma chamber 20 are covered by insulators 30, 32, respectively. For example, the insulators 30, 32 are made of quartz, alumina, or the like.

The insulator 32 has a plurality of holes 33 through which the plasma 24 can pass, and which are arranged in the X direction. The holes 33 are disposed at positions corresponding to holes 83, 85 (described later) of the exit electrode 80.

A plasma electrode 34 is disposed in close proximity to or in butting against the lower face of the insulator 32. The plasma electrode 34 has a plurality of holes 35 through which the plasma 24 can pass, and which are disposed at positions corresponding to the holes 33. For example, the plasma electrode 34 is made of carbon.

Figure 5:
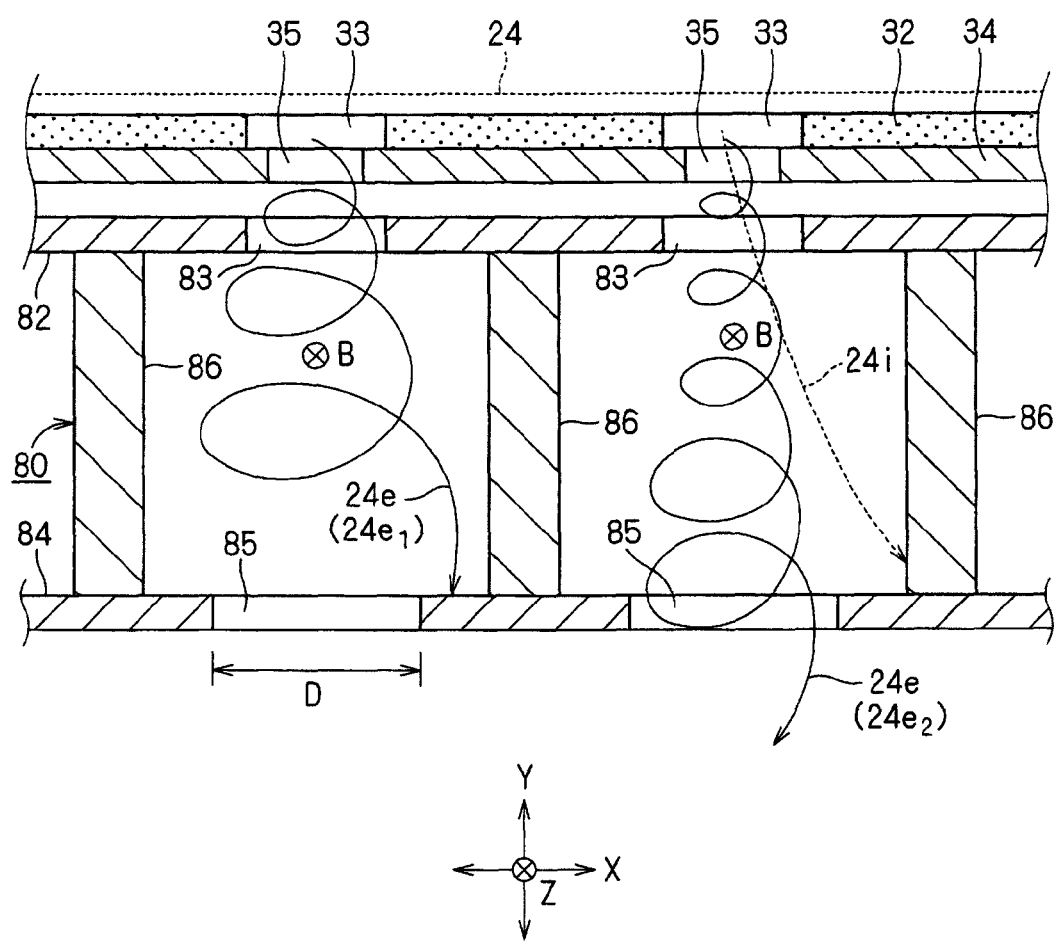
FIG. 5 is a view schematically showing an example of motions of electrons and ions in a plasma in the vicinity of the exit electrode.

The plasma electrode 34 is in contact with the plasma 24 to ensure a potential of the plasma 24, and set to have the same potential as the vacuum container 22. When the plasma chamber 20 is completely surrounded by an insulator, no conductor is in contact with the plasma 24, and hence a potential is not applied to the plasma 24, so that no current flows in the plasma 24 and electrons are hardly extracted from the plasma 24. However, the plasma electrode 34 can prevent such a situation from occurring. In order to attain both this effect and the above-described contamination suppression in the plasma 24, the holes 33 of the insulator 32 are made slightly larger than the holes 35 of the plasma electrode 34 (see also FIG. 5), so that the area where the plasma electrode 34 is in contact with the plasma 24 is reduced to a necessary minimum level, whereby the contamination of the plasma 24 due to metal particles from the plasma electrode 34 is suppressed to a minimum degree.

Alternatively, in place of the plasma electrode 34, the exit electrode 80 may be placed in close proximity to or in butting against the insulator 32 so as to exert a similar function as the plasma electrode 34.

The antenna chamber 40 is exhausted to vacuum through an air discharge port 50 by a vacuum exhaust apparatus which is not shown (for example, identical with the vacuum exhaust apparatus which exhausts the plasma chamber 20). A metal grid 52 which suppresses the high-frequency wave 48 radiated from the antenna 42 from leaking out is disposed in an inlet of the air discharge port 50. A gas 28 is not introduced into the antenna chamber 40. Therefore, a pressure difference between the plasma chamber 20 and the antenna chamber 40 is approximately equal to the pressure of the gas 28 in the plasma chamber 20. For example, the pressure is very low or about $10^{-3}$ to $10^{-2}$ Pa.

For example, the partition plate 54 is made of an insulator such as quartz or alumina. The partition plate 54 functions to block the gas 28 introduced into the plasma chamber 20 from leaking to the antenna chamber 40, but it is not necessary to completely (i.e., 100%) block the leakage. For example, slight leakage from end portions of the partition plate 54 may occur. Essentially, it is requested to block the gas 28 by a degree at which a plasma is not generated in the antenna chamber 40.

The partition plate 54 is required to have a strength which can withstand the pressure difference between the plasma chamber 20 and the antenna chamber 40, and, in the case where the antenna 42 is butted against the plate as in the exemplary embodiment, withstand the pressing force, but is not necessary to have a thickness which can withstand the atmospheric pressure. Therefore, the partition plate 54 can be thinned, so that the high-frequency wave 48 radiated from the antenna 42 can be introduced with low loss into the plasma chamber 20. For example, the partition plate 54 may have a thickness of about 1 mm to 3 mm.

In the exemplary embodiment, the antenna 42 has a slender plate-like shape which extends in the X direction along the partition plate 54. The high-frequency wave 48 is supplied from a high-frequency power supply (for example, a microwave power supply) which is not shown to the antenna 42 via an impedance matching circuit and the like, and a power supply conductor 44. An insulator 46 is disposed in a portion where the power supply conductor 44 passes through the upper lid 23. For example, the high-frequency wave 48 is a microwave of a frequency of 2.45 GHz. However, the high-frequency wave is not restricted to this. The length of the antenna 42 is determined depending on the frequency of the high-frequency wave 48.

In the exemplary embodiment, the antenna 42 has a length which is equal to an integer multiple (for example, two times) of the half wavelength with respect to the frequency of 2.45 GHz. According to the configuration, the high-frequency wave 48 can be radiated from a wide region along the X direction, and hence the plasma 24 which is highly homogenous in the X direction can be generated in the plasma chamber 20.

In a related-art conventional configuration, ends of an antenna are opened, and hence the positions of nodes of the electric field are changed depending on the high-frequency absorbing conditions of a plasma, and hence the place where a plasma is generated is unstable. In the exemplary embodiment, the length of the antenna 42 is set to an integer multiple of the half wavelength as described above, and the ends of the antenna 42 are electrically connected to the upper lid 23 of the vacuum container 22 to be set as an electrically fixed end. Therefore, the ends of the antenna 42 can be always set as nodes of the high-frequency electric field. According to the configuration, the potential distribution of the antenna 42 can be stabilized. Therefore, the place where a plasma is generated can be specified, and the handling of the plasma is facilitated.

The antenna 42 may be butted against the partition plate 54 as in the exemplary embodiment. According to the configuration, the following effects are attained.

Since the antenna 42 can be made maximally closer to the plasma chamber 20, the high-frequency wave 48 radiated from the antenna 42 can be efficiently introduced into the plasma chamber 20 through the partition plate 54. As a result, the generation efficiency of the plasma 24 in the plasma chamber 20 can be further improved.

When the antenna 42 and the partition plate 54 are separated from each other, they functions as a capacitor, and charges of mutually opposite polarities appear on the surfaces of the antenna 42 and the partition plate 54 to generate an electric field therebetween. There arises a possibility that unwanted discharge is generated between the antenna 42 and the partition plate 54. By contrast, since the antenna 42 is butted against the partition plate 54, it is possible to prevent the phenomenon that an electric field is generated between the antenna 42 and the partition plate 54 and unwanted discharge is generated between them, from occurring. As a result, it is possible to prevent disadvantages due to discharge, such as a damage of the partition plate 54 from occurring.

Furthermore, heat conduction to the antenna 42 allows heat of the partition plate 54 to escape, whereby the partition plate 54 can be cooled. As a result, it is possible to suppress the temperature rise of the partition plate 54 and further prolong the life period of the partition plate 54.

In addition to the configuration where the antenna 42 extends in the X direction, the further configuration where also the magnet device 60 extends in the X direction along which the antenna 42 extends is employed. Furthermore, the exit electrode 80 has the pluralities of holes 83, 85 arranged in the X direction along which the antenna 42 extends. According to the structure, the plasma 24 which is wide and highly homogenous in the X direction can be generated and emitted. As a result, as described above, the plasma 24 can be homogeneously supplied to in the vicinity of the ion beam 2 which is scanned in the X direction (or a ribbon-like ion beam which is wide in the X direction), and the suppression of charge up in the substrate 4 can be uniformly performed.

In the exemplary embodiment, the magnet device 60 includes: first and second magnets 62, 64 which are placed so as to be opposed to each other across the plasma chamber 20 in the Z direction; and a yoke 70 having the following structure.

In the exemplary embodiment, the magnets 62, 64 are permanent magnets. Each of the magnets 62, 64 may be configured by a single bar-like permanent magnet, or an arrangement in which plural bar-like permanent magnets are arranged in the X direction. In FIG. 2, the magnetic field B generated by the magnets 62, 64 is directed in the Z direction (i.e., the traveling direction of the ion beam 2). Alternatively, the magnetic field may be directed in the opposite direction. In the exemplary embodiment, in order to ease a concentration of the magnetic field, magnetic poles 66, 68 each configured by a ferromagnetic member having a semicircular section shape are disposed on the inner side faces of the magnets 62, 64, respectively.

The yoke 70 has: a connecting portion 71 which connects the back faces of the magnets 62, 64 to each other; and projected portions 72 which are opposed to each other, and which inward extend in the vicinities of the lateral sides of the exit electrode 80, and downstream from the magnets 62, 64 in the emission direction of the plasma 24 (more specifically, to positions corresponding to a portion between a first exit electrode 82 and a second exit electrode 84). The connecting portion 71 and the projected portions 72 are made of a ferromagnetic material. As described above, the upper lid 23 of the vacuum container 22 is made of a ferromagnetic material, and constitutes a part of the connecting portion 71.

The yoke 70 surrounds the outsides of the magnets 62, 64 except a portion between the projected portions 72. Therefore, a leakage magnetic field, particularly that into the emission region of the plasma 24 can be reduced, so that it is possible to prevent a phenomenon that the density distribution of electrons in the plasma 24 emitted to the outside is disturbed by the leakage magnetic field to become uneven, from occurring. As a result, in the case where charge-up in the substrate 4 due to ion beam irradiation is suppressed by using electrons in the plasma 24, the uniformity of the suppression of charge up can be enhanced.

Figure 3:
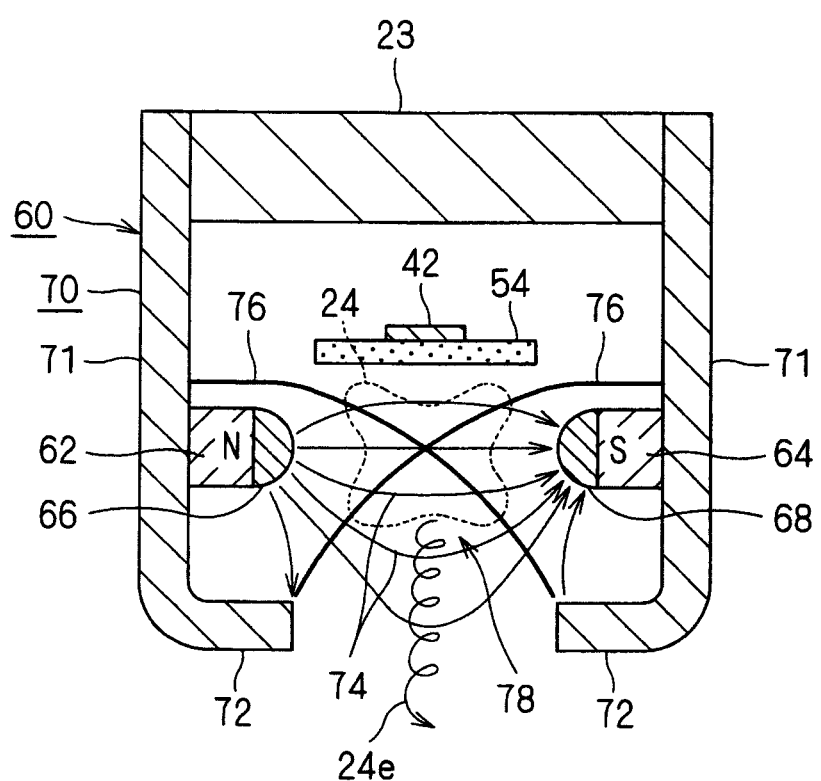
FIG. 3 is a diagram showing an example of results of analyses of the manner of a magnetic field due to a magnet device.

FIG. 3 is a diagram showing an example of results of analyses of the manner of the magnetic field due to the magnet device 60. Typical magnetic force lines 74 indicating the magnetic field B are shown in FIG. 3. From the analyses, it is confirmed that the leakage magnetic field from the magnet device 60 to the outside is very weak.

Furthermore, it is checked that a region 76 (the portion indicated by the thick lines) where the electron cyclotron resonance conditions are satisfied is remote from the partition plate 54. A dense plasma 24 is generated in the vicinity of the region 76. Since the region is remote from the partition plate 54, the thermal input and sputtering due to the plasma 24 occur in the partition plate 54 at a lower degree as compared with the antenna cover in the related art.

As seen also from FIG. 3, in the magnet device 60, magnetic force lines between the magnets 62, 64 are not expanded (this is called a mirror magnetic field), and such magnetic force lines 74 are arranged in the X direction. Therefore, electrons 24e in the plasma 24 cannot come out from the magnet device 60 without crossing the magnetic force lines 74. When the electrons 24e cross the magnetic force lines 74, the electrons 24e are constrained to the magnetic field B by Larmor motion, so that their velocity is lowered, and hence the electrons 24e frequently collide with gas molecules. When the electrons 24e collide with gas molecules, the energy of the electrons 24e is reduced. As described above, therefore, electrons in the plasma 24 emitted to the outside are mainly configured by electrons of low energy. For example, the electrons can mainly consist of those having energy of about 1 eV to 10 eV.

Furthermore, the disposition of the projected portions 72 in the yoke 70 intensifies the magnetic field in the region 78 which is surrounded by the projected portions 72 on the both sides and the first and second magnets 62, 64. When the electrons 24e cross the magnetic field, the electrons 24e more frequently collide with the gas molecules, so that the energy of the electrons 24e is further reduced. Therefore, the rate of low-energy electrons contained in the plasma 24 emitted to the outside can be further increased. As a result, in the case where charge-up in the substrate 4 due to ion beam irradiation is suppressed by using the electrons 24e in the plasma 24, the negative charge-up voltage in the substrate 4 can be suppressed to a lower level.

In the exemplary embodiment, the exit electrode 80 includes: the first exit electrode 82 having the plurality of holes 83 that are arranged in the X direction along which the antenna 42 extends; the second exit electrode 84 which is disposed downstream (i.e., downward in the Y direction) from the first exit electrode 82 in the emission direction of the plasma 24, and which has the plurality of holes 85 at positions corresponding to the plurality of holes 83 of the first exit electrode 82; and a partition wall 86 which is disposed between the first exit electrode 82 and the second exit electrode 84 to separate adjacent holes 83 of the first exit electrodes 82 from each other and separate adjacent holes 85 of the second exit electrodes 84 from each other. The electrodes 82, 84 are set to have the same potential as the vacuum container 22 and the plasma electrode 34.

Figure 4:
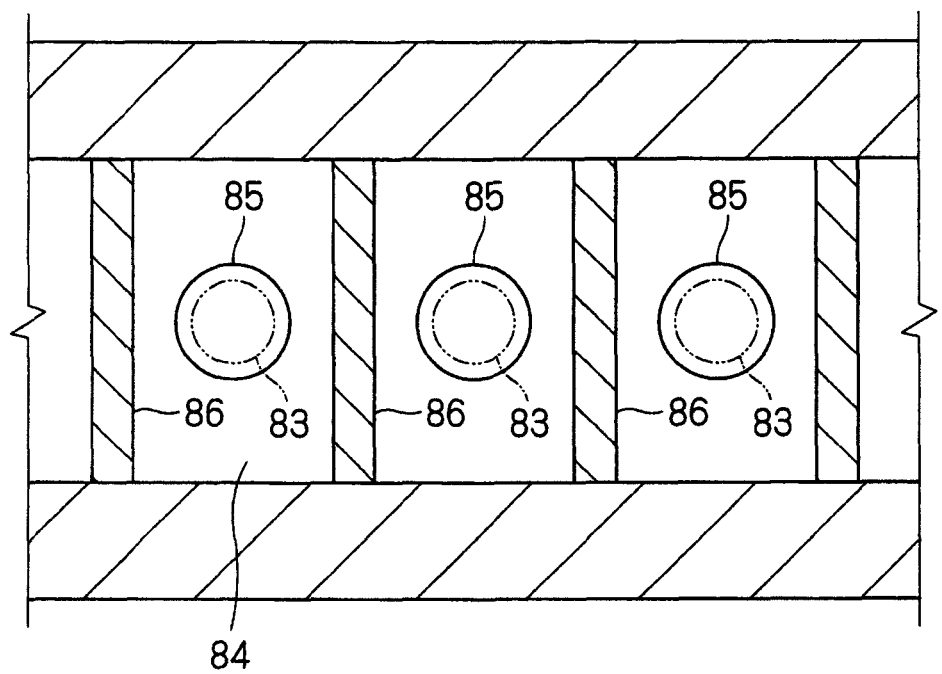
FIG. 4 is a cross sectional view showing an example of a partition wall of an exit electrode.
Figure 4:
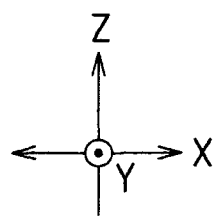

Also referring to FIG. 4, in the exemplary embodiment, the holes 83, 85 of the electrodes 82, 84 are arranged in one row along the X direction. Alternatively, the holes 83, 85 may be arranged in a plurality of rows. In the case where the holes 83, 85 are arranged in a plurality of rows, a further partition wall(s) separating the rows from each other may be disposed in the same concept as the partition wall 86.

The above-described structure of the exit electrode 80 blocks high-energy electrons and ions, and selectively (in other words, preferentially) allows low-energy electrons to pass through the exit electrode 80. This structure will be described in further detail with reference to FIG. 5.

Although weak, the magnetic field B generated by the magnet device 60 exists in the vicinity of the exit electrode 80. The magnetic field B exists both in the case where the magnet device 60 does not have the yoke 70 of the structure such as shown in FIGS. 2 and 3, and the case where the magnet device has the yoke 70, because the magnet device 60 has the projected portions 72. The magnetic field B becomes weaker as more separating from the magnet device 60 downward in the Y direction. More specifically, the magnetic field B in the vicinity of the first exit electrode 82 is stronger than that in the vicinity of the second exit electrode 84.

When the electrons 24$e$ and ions 24$i$ in the plasma 24 enter the exit electrode 80, these charged particles perform spiral Larmor motion in the magnetic field B, and the Larmor radius becomes larger because the magnetic field B is weaker as more separating from the magnet device 60.

The electrons 24$e$ are configured by electrons of different energies. In the vicinity of the first exit electrode 82, the magnetic field B is strong, the Larmor radii of both high-energy electrons 24$e_1$ and low-energy electrons 24$e_2$ are smaller than the size of the holes 83 of the first exit electrode 82, and hence the both electrons 24$e_1$ and 24$e_2$ pass through the holes 83. In the vicinity of the second exit electrode 84, however, the magnetic field B is weak, and the Larmor radii of both high-energy electrons 24$e_1$ and low-energy electrons 24$e_2$ are large. Among the electrons, the Larmor radius of the low-energy electrons 24$e_2$ is smaller than the size of the holes 85 of the second exit electrode 84, and hence the low-energy electrons 24$e_2$ can pass through the holes 85. However, the Larmor radius of the high-energy electrons 24$e_1$ is larger than the size of the holes 85 of the second exit electrode 84, and hence the high-energy electrons 24$e_1$ cannot pass through the holes 85, so that the high-energy electrons collide with the surface of the second exit electrode 84 and the like. This function can prevent the high-energy electrons from being emitted through the second exit electrode 84.

The ions 24$i$ have a mass which is very larger than that of the electrons 24$e$, and hence their Larmor radius is very large. However, the ions 24$i$ are bent to a predetermined direction by mainly the strong magnetic field B in the vicinity of the first exit electrode 82, and hence cannot pass through the holes 85 of the second exit electrode 84, so that the ions collide with the partition wall 86 and the surface of the second exit electrode 84.

By the above-described functions, in the exit electrode 80, it is possible that high-energy electrons and ions are blocked, and low-energy electrons are selectively allowed to pass through the exit electrode 80. In this case, since ions can be blocked, the particles which are emitted through the exit electrode 80 mainly consist of electrons. The energy of the electrons 24$e$ which are allowed to pass through can be adjusted by the size (for example, the diameter D) of the holes 85 of the second exit electrode 84. When the holes 85 are made small, for example, the energy of the electrons 24$e$ which are allowed to pass through the second exit electrode 84 is reduced, and, when the holes 85 are made large, the energy of the electrons 24$e$ which are allowed to pass through the second exit electrode 84 is increased.

As a result, in the case where charge-up in the substrate 4 due to ion beam irradiation is suppressed by using the low-energy electrons 24$e$ which are selectively allowed to pass, the negative charge-up voltage in the substrate 4 can be further suppressed to a lower level.

When ions in the plasma 24 pass through the exit electrode 80 and enter the beam line of the ion beam 2, the ions cause noises and the like to be produced in the measurement of the beam current of the ion beam 2, thereby sometimes adversely affecting the measurement of the ion beam 2. The exit electrode 80 can prevent the phenomenon from occurring.

As in the example shown in FIG. 1, a negative extraction voltage $V_E$ with reference to the potential of the vacuum chamber 6 may be applied by a DC extraction power supply 92 to the exit electrode 80 and the portions of the same potential as the exit electrode 80. According to the configuration, the electrons 24$e$ are easily extracted through the exit electrode 80 from the plasma 24 generated in the plasma chamber 20. The level of the extraction voltage $V_E$ may be set to, for example, about 3 V to 25 V.

While the present inventive concept has been shown and described with reference to certain exemplary embodiments thereof, it will be understood by those skilled in the art that various changes in form and details may be made therein without departing from the spirit and scope of the invention as defined by the appended claims.

What is claimed is:

1. A plasma generating apparatus for generating and emitting plasma to an outside of the plasma generating apparatus, comprising:

a plasma chamber exhausted to vacuum and into which gas and a high-frequency wave are introduced;

an exit electrode disposed on one side of said plasma chamber and that includes one or more holes through which the plasma passes;

an antenna chamber disposed adjacently to said plasma chamber and exhausted to vacuum;

an antenna disposed in said antenna chamber and that radiates the high-frequency wave;

a partition plate made of an insulating material, that separates said plasma chamber from said antenna chamber to block the gas from entering said antenna chamber, and that allows the high-frequency wave radiated from said antenna to enter said plasma chamber; and a magnet device disposed outside said plasma chamber, and that generates, in said plasma chamber, a magnetic field that causes electron cyclotron resonance in a direction intersecting with a direction along which the plasma is emitted from said exit electrode, wherein the exit electrode includes:

a first exit electrode that includes a plurality of holes;

a second exit electrode disposed downstream from the first exit electrode in the emission direction of the plasma and that includes a plurality of holes at positions corresponding to the plurality of holes of the first exit electrode; and a partition wall disposed between the first exit electrode and the second exit electrode to separate adjacent holes of the first exit electrodes from each other and separate adjacent holes of the second exit electrode from each other, wherein a plasma electrode has a plurality of holes and is disposed in a side of the plasma of the first electrode, and wherein the first exit electrode, the second exit electrode, the plasma electrode, and the plasma chamber are set to the same electric potential.

2. The plasma generating apparatus according to claim 1, wherein said antenna has a shape that extends along said partition plate, said magnet device extends in a direction along which said antenna extends, and said exit electrode includes a plurality of holes that are arranged in the direction along which said antenna extends.

3. The plasma generating apparatus according to claim 1, wherein said antenna is butted against said partition plate.

4. The plasma generating apparatus according to claim 1, wherein said magnet device includes:
 first and second magnets placed so as to be opposed to each other across said plasma chamber; and
 a yoke including:
  a connecting portion that connects back faces of said first and second magnets to each other; and
  a plurality of projected portions opposed to each other, and that inwardly extend in vicinities of lateral sides of said exit electrode and downstream from said first and second magnets in an emission direction of the plasma,
 wherein said yoke surrounding outsides of said first and second magnets except a portion between said projected portions.

5. The plasma generating apparatus according to claim 1, further comprising:
 an insulator having a plurality of holes that is disposed on a side of the plasma of the first exit electrode;
 the plasma electrode that is disposed between the insulator and the first exit electrode; and
 wherein said holes of the insulator are slightly larger than said holes of the plasma electrode.

6. The plasma generating apparatus according to claim 1, wherein a center of each hole of the first exit electrode concentrically coincides with a center of each hole of the second exit electrode.

\* \* \* \* \*